US008076216B2

(12) United States Patent
Johnson

(10) Patent No.: US 8,076,216 B2
(45) Date of Patent: Dec. 13, 2011

(54) METHODS AND APPARATUS FOR THINNING, TESTING AND SINGULATING A SEMICONDUCTOR WAFER

(75) Inventor: Morgan T. Johnson, Portland, OR (US)

(73) Assignee: Advanced Inquiry Systems, Inc., Hillsboro, OR (US)

(*) Notice: Subject to any disclaimer, the term of this patent is extended or adjusted under 35 U.S.C. 154(b) by 0 days.

(21) Appl. No.: 12/617,691

(22) Filed: Nov. 12, 2009

(65) Prior Publication Data

US 2010/0144069 A1 Jun. 10, 2010

Related U.S. Application Data

(60) Provisional application No. 61/113,507, filed on Nov. 11, 2008.

(51) Int. Cl.
H01L 21/00 (2006.01)
(52) U.S. Cl. .......... 438/464; 438/460; 438/465; 438/17
(58) Field of Classification Search .......... 438/17, 438/464
See application file for complete search history.

(56) References Cited

U.S. PATENT DOCUMENTS

| 5,937,515 | A | 8/1999 | Johnson | |
|---|---|---|---|---|
| 6,737,879 | B2 | 5/2004 | Johnson | |
| 6,991,969 | B2 | 1/2006 | Johnson | |
| 7,282,931 | B2 | 10/2007 | Johnson | |
| 7,453,277 | B2 | 11/2008 | Johnson | |
| 7,459,924 | B2 | 12/2008 | Johnson | |
| 7,532,021 | B2 | 5/2009 | Johnson | |
| 7,791,174 | B2 | 9/2010 | Johnson | |
| 2004/0212389 | A1* | 10/2004 | Hamren et al. | 324/765 |
| 2007/0229105 | A1* | 10/2007 | Johnson | 324/758 |
| 2007/0259509 | A1* | 11/2007 | Kuo | 438/459 |
| 2008/0003819 | A1 | 1/2008 | Johnson et al. | |
| 2008/0090380 | A1* | 4/2008 | Gardner et al. | 438/455 |

* cited by examiner

Primary Examiner — Ajay K Arora
(74) Attorney, Agent, or Firm — Perkins Coie LLP

(57) ABSTRACT

A wafer translator is provided with a patterned layer of wafer bonding thermoset plastic and is removably attached with a wafer so as to form a wafer/wafer translator pair. The wafer translator acts as a mechanical support during a thinning process as well as during a wafer dicing operation. The singulated integrated circuits are then removed from the wafer translator. In some embodiments, wafer level testing of the integrated circuits on the wafer is performed subsequent to the wafer thinning process but before the wafer and wafer translator are separated. In other embodiments, wafer level testing of the integrated circuits on the wafer is performed subsequent to the wafer dicing operation but before the diced wafer and wafer translator are separated.

18 Claims, 5 Drawing Sheets

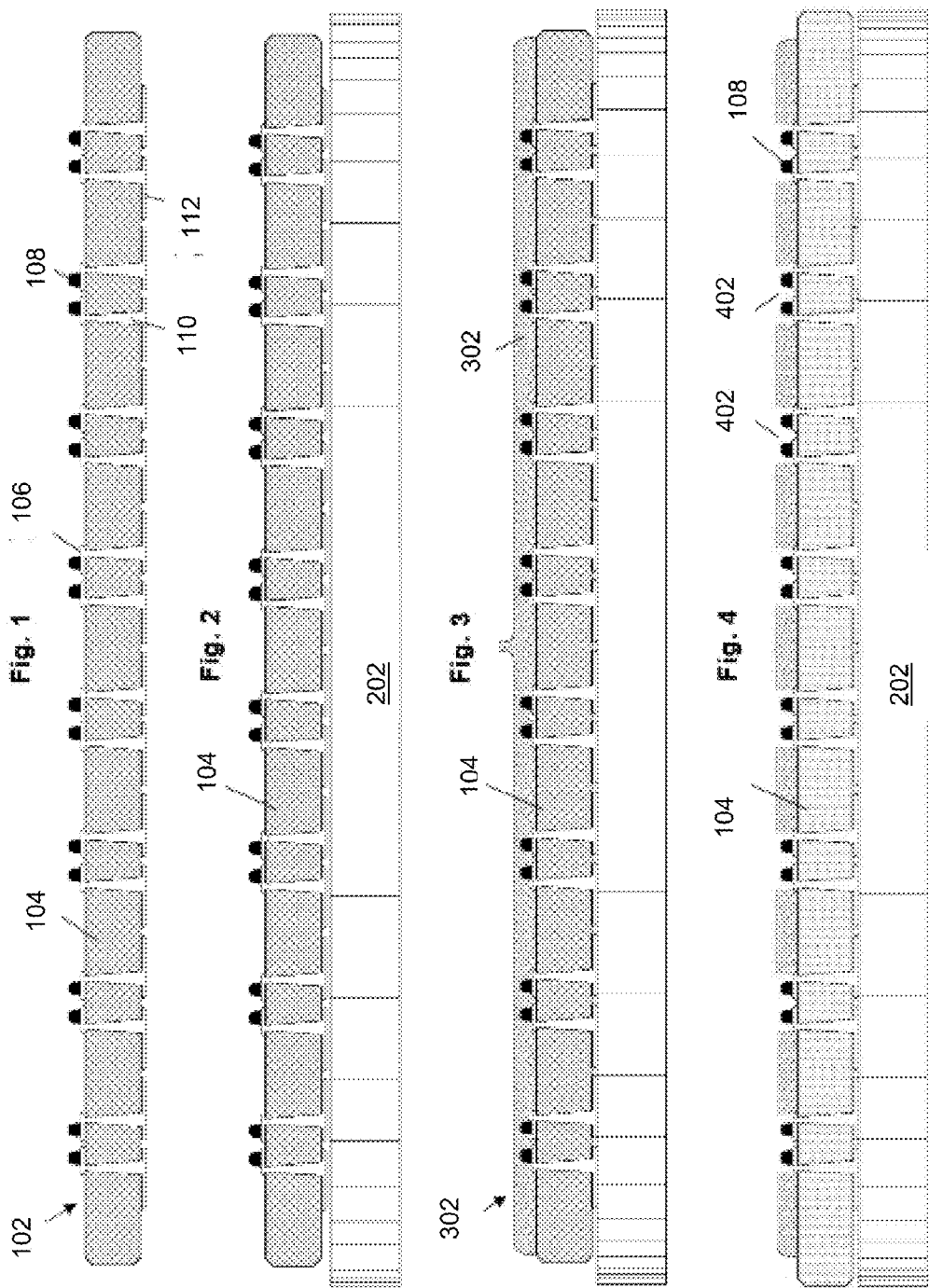

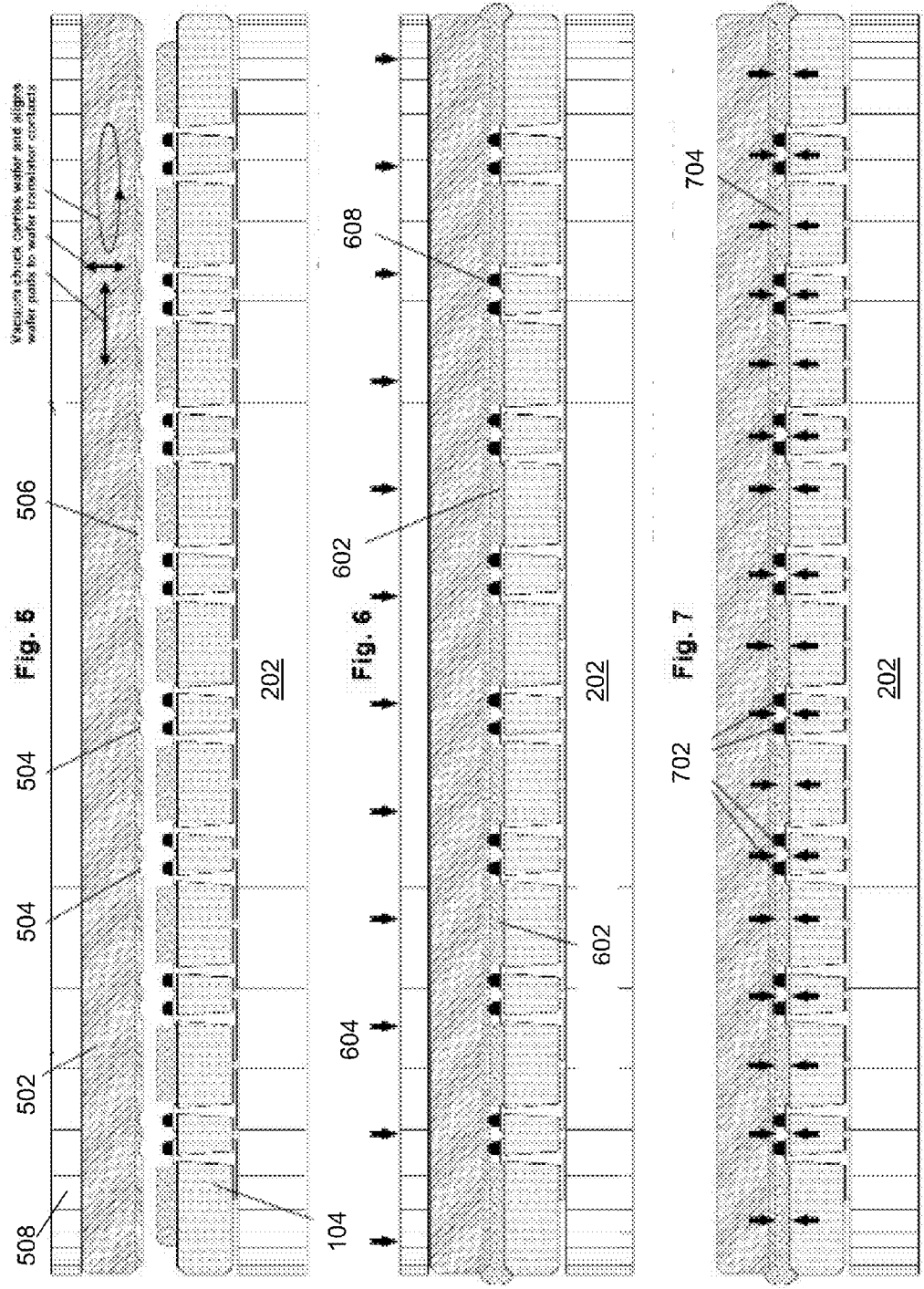

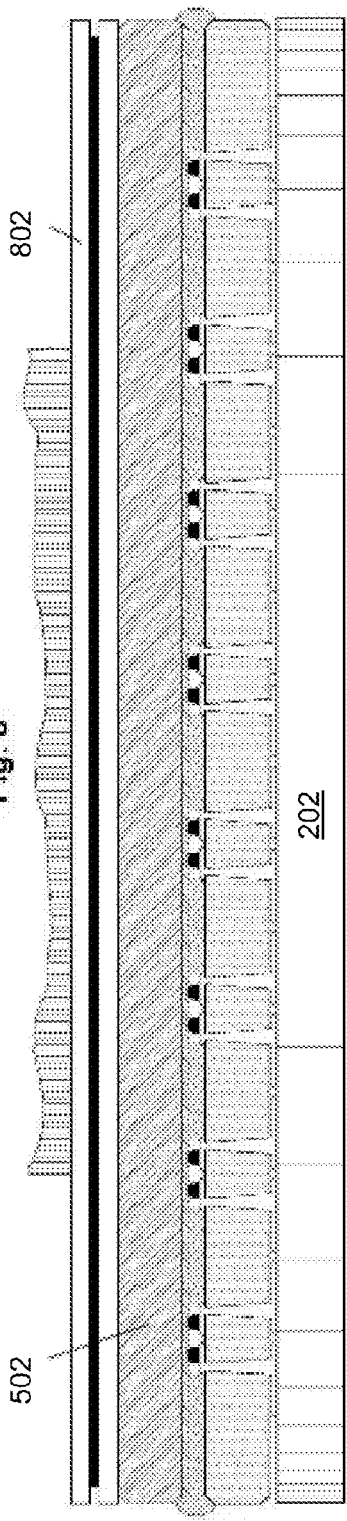
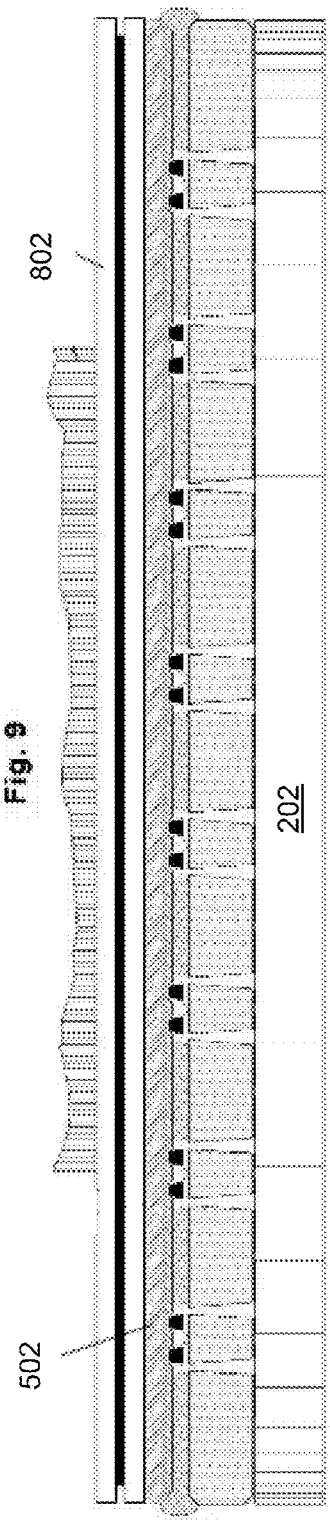
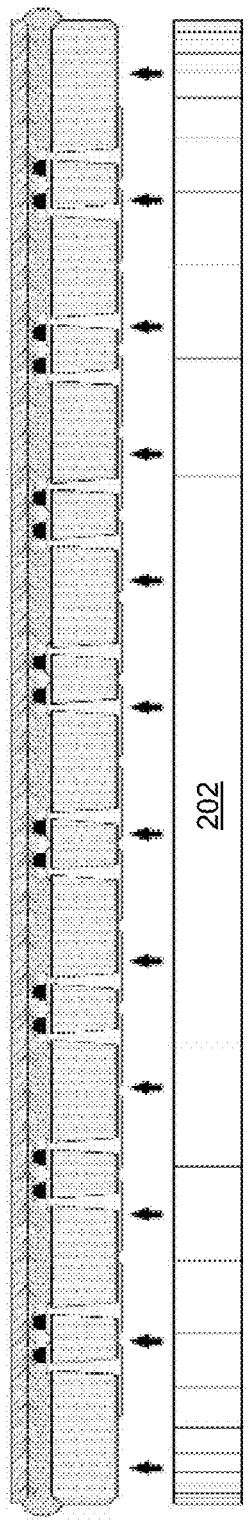
Fig. 8
Fig. 9
Fig. 10

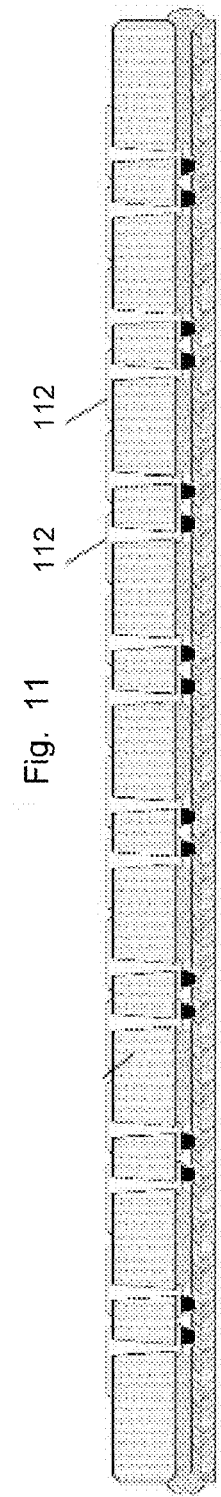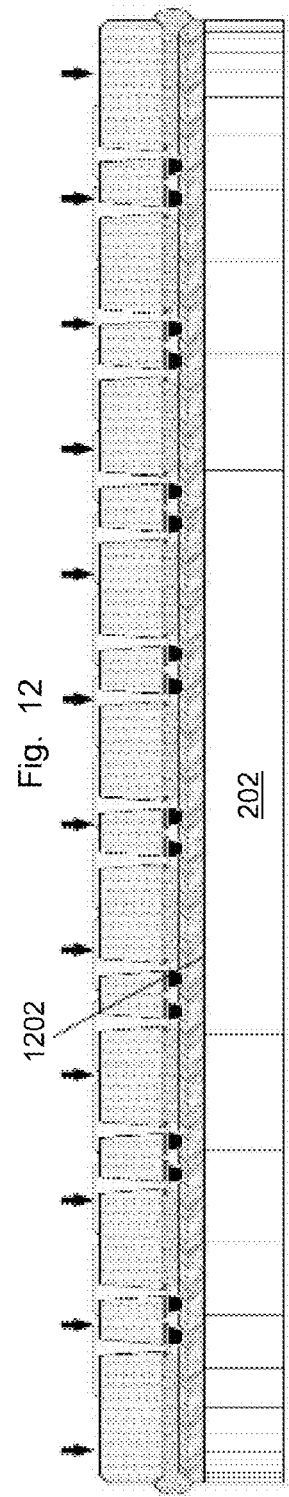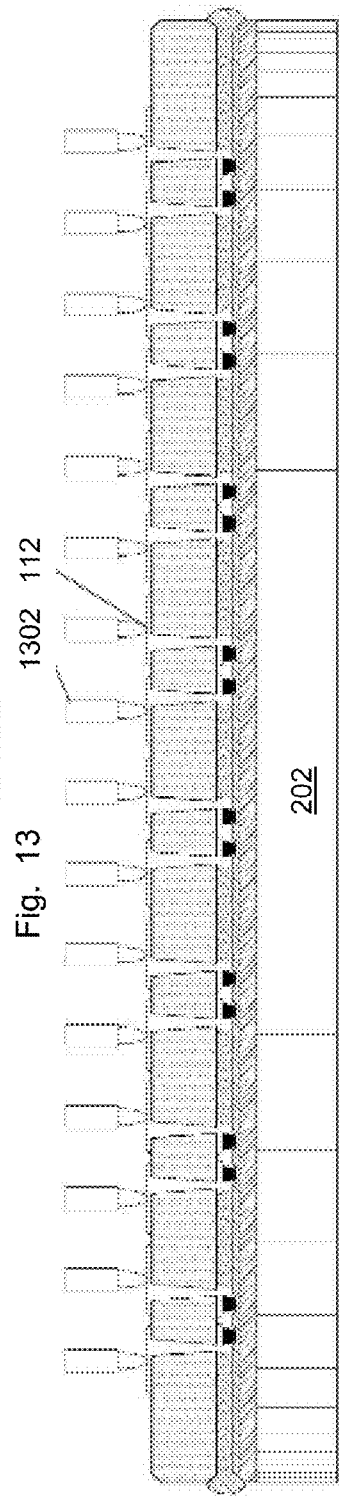

METHODS AND APPARATUS FOR THINNING, TESTING AND SINGULATING A SEMICONDUCTOR WAFER

RELATED APPLICATIONS

This application claims the benefit of Provisional Application No. 61/113,507, filed 11 Nov. 2008, and entitled "A Method of Testing Thinned And Singulated Die At The Wafer Level", the entirety of which is hereby incorporated by reference.

FIELD OF THE INVENTION

The present invention relates generally to semiconductor test equipment, and more particularly relates to methods and apparatus for providing electrical pathways between the pads of integrated circuits on a wafer and circuitry external to the wafer.

BACKGROUND

Advances in semiconductor manufacturing technology have resulted in, among other things, reducing the cost of sophisticated electronics to the extent that integrated circuits have become ubiquitous in the modern environment.

As is well-known, integrated circuits are typically manufactured in batches, and these batches usually contain a plurality of semiconductor wafers within and upon which integrated circuits are formed through a variety of semiconductor manufacturing steps, including, for example, depositing, masking, patterning, implanting, etching, and so on.

Completed wafers are tested to determine which die, or integrated circuits, on the wafer are capable of operating according to predetermined specifications. In this way, integrated circuits that cannot perform as desired are not packaged, or otherwise incorporated into finished products.

Integrated circuits are typically manufactured on roughly circular semiconductor substrates, or wafers. Further, it is common to form such integrated circuits so that conductive regions disposed on, or close to, the uppermost layers of the integrated circuits are available to act as terminals for connection to various electrical elements disposed in, or on, the lower layers of those integrated circuits. In testing, these conductive regions are commonly contacted with a probe card.

In conventional manufacturing processes, subsequent to forming integrated circuits on the wafer, those unsingulated integrated circuits are tested, and the wafer is then thinned and singulated. During the thinning process it is common to attach the topside of the wafer to a carrier wafer to provide mechanical support for the thinning operations.

What is needed are methods and apparatus that enable wafer level testing of integrated circuits subsequent wafer thinning, and subsequent to wafer dicing.

SUMMARY OF THE INVENTION

Briefly, a wafer translator is provided with a patterned layer of wafer bonding thermoset plastic and is removably attached with a wafer so as to form a wafer/wafer translator pair. The wafer translator acts as a mechanical support during a thinning process as well as during a wafer dicing operation. The singulated integrated circuits are then removed from the wafer translator.

In some embodiments, wafer level testing of the integrated circuits on the wafer is performed subsequent to the wafer thinning process but before the wafer and wafer translator are separated. In other embodiments, wafer level testing of the integrated circuits on the wafer is performed subsequent to the wafer dicing operation but before the diced wafer and wafer translator are separated.

BRIEF DESCRIPTION OF THE DRAWINGS

FIG. 1 is a cross-sectional representation of a silicon-core wafer translator.

FIG. 2 is a cross-sectional representation of a silicon-core wafer translator placed inquiry-side down on a temperature controlled vacuum chuck.

FIG. 3 is a cross-sectional representation of a silicon-core wafer translator placed inquiry-side down on a temperature controlled vacuum chuck and having a layer of wafer bonding thermo-set plastic on the wafer-side thereof.

FIG. 4 shows the structure of FIG. 3 after openings have been formed in the wafer bonding thermo-set plastic so as to expose the wafer-side contact structures of the silicon-core wafer translator.

FIG. 5 shows the structure of FIG. 4 after a wafer to be thinned is aligned to the wafer-side of the silicon-core wafer translator.

FIG. 6 shows the structure of FIG. 5 after the circuit-side of the wafer to be thinned is brought into contact with the wafer translator having the patterned wafer bonding thermoset plastic layer thereon.

FIG. 7 shows the structure of FIG. 6 after the wafer bonding thermoset plastic has cooled, and brought the wafer and wafer translator into tighter contact.

FIG. 8 shows the structure of FIG. 7 after a wafer thinning apparatus has been brought into contact with the backside of the wafer to be thinned.

FIG. 9 is similar to FIG. 8, but shows that the wafer has been reduced in thickness by the wafer thinning operation.

FIG. 10 shows the structure of FIG. 9 after the wafer thinning apparatus is removed and the wafer/wafer translator pair is released from the temperature controlled vacuum chuck.

FIG. 11 shows the wafer/wafer translator pair of FIG. 11 inverted so that the backside of the thinned wafer is superjacent the temperature controlled vacuum chuck and the inquiry-side of the wafer translator is facing away from the temperature controlled vacuum chuck.

FIG. 12 is similar to FIG. 11, but shows the backside of the thinned wafer in contact with the temperature controlled vacuum chuck.

FIG. 13 shows the structure of FIG. 12 after contact probes of tester electronics are brought into contact with contact pads on the inquiry-side of the wafer translator.

DETAILED DESCRIPTION

Figure 14:
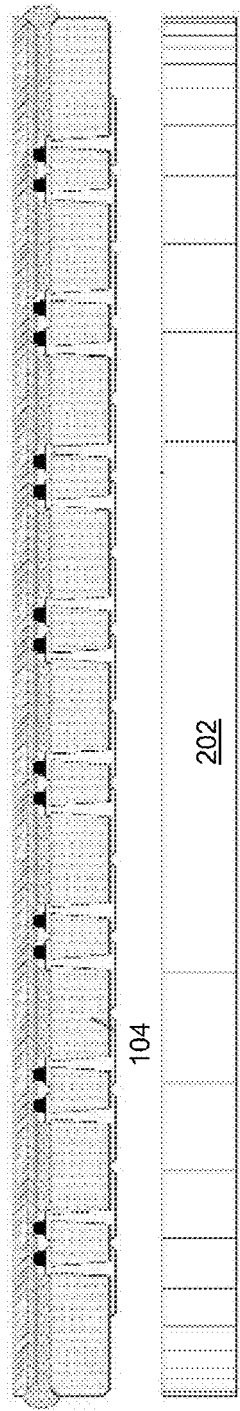
FIG. 14 is a shows the structure of FIG. 13 after the wafer/wafer translator pair is released from the temperature controlled vacuum chuck and inverted.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Terminology

Pad refers to a metallized region of the surface of an integrated circuit, which is used to form a physical connection terminal for communicating signals to and/or from the integrated circuit.

The expression "wafer translator" refers to an apparatus facilitating the connection of pads (sometimes referred to as terminals, I/O pads, contact pads, bond pads, bonding pads, chip pads, test pads, or similar formulations) of unsingulated integrated circuits, to other electrical components. It will be appreciated that "I/O pads" is a general term, and that the present invention is not limited with regard to whether a particular pad of an integrated circuit is part of an input, output, or input/output circuit. A wafer translator is typically disposed between a wafer and other electrical components, and/or electrical connection pathways. The wafer translator is typically removably attached to the wafer (alternatively the wafer is removably attached to the translator). The wafer translator includes a substrate having two major surfaces, each surface having terminals disposed thereon, and electrical pathways disposed through the substrate to provide for electrical continuity between at least one terminal on a first surface and at least one terminal on a second surface. The wafer-side of the wafer translator has a pattern of terminals that matches the layout of at least a portion of the pads of the integrated circuits on the wafer. The wafer translator, when disposed between a wafer and other electrical components such as an inquiry system interface, makes electrical contact with one or more pads of a plurality of integrated circuits on the wafer, providing an electrical pathway therethrough to the other electrical components. The wafer translator is a structure that is used to achieve electrical connection between one or more electrical terminals that have been fabricated at a first scale, or dimension, and a corresponding set of electrical terminals that have been fabricated at a second scale, or dimension. The wafer translator provides an electrical bridge between the smallest features in one technology (e.g., pins of a probe card) and the largest features in another technology (e.g., bonding pads of an integrated circuit). For convenience, wafer translator is referred to herein simply as translator where there is no ambiguity as to its intended meaning. In some embodiments a flexible wafer translator offers compliance to the surface of a wafer mounted on a rigid support, while in other embodiments, a wafer offers compliance to a rigid wafer translator. The surface of the translator that is configured to face the wafer in operation is referred to as the wafer-side of the translator. The surface of the translator that is configured to face away from the wafer is referred to as the inquiry-side of the translator. An alternative expression for inquiry-side is tester-side.

The term, via, refers to a structure for electrical connection of conductors from different interconnect levels. The term, via, is sometimes used in the art to describe both an opening in an insulator in which the structure will be completed, and the completed structure itself. For purposes of this disclosure, "via" refers to the completed structure, and "via opening" refers to an opening through an insulator layer which is subsequently filled with a conductive material.

The terms chip, integrated circuit, semiconductor device, and microelectronic device are sometimes used interchangeably in this field. The present invention relates to the manufacture and test of chips, integrated circuits, semiconductor devices and microelectronic devices as these terms are commonly understood in the field.

Overview

The wafer translator acts as a carrier wafer for the wafer to be thinned. The wafer and wafer translator are aligned, heated and joined by an apparatus that is referred to as an aligner. After cooling brings the contacts on the wafer-side of the wafer translator into electrical contact with the integrated circuits to be tested on the target wafer, the wafer is thinned by conventional means. The integrated circuits may be singulated by a wafer saw, or similar means. The inquiry-side of the wafer translator is brought into contact with test electronics and every die is tested and mapped. The assembly is heated and a pick and place machine removes the die and places them in a bare die waffle pack for shipping.

In one embodiment, the wafer translator can be structured as a wafer level chip scale package (WLCSP) that is left attached to the fully tested but unsingulated wafer. Both the wafer and wafer translator, in the attached state, are run through a wafer saw forming WLCSPs with, for example, solder balls to create a micro ball grid array The wafer translator can be left attached to the thinned die to provide a stable fixture for any other modifications of the bare die, for example, printing of die attach adhesive to the back of each die without having to handle each die. In another embodiment, the wafer translator can be cooled to counter the heat of testing the die at elevated temperature and preserve the adhesive bond In another embodiment, the wafer translator can have integrated tester electronics so that connecting to a free standing semiconductor test machine is not required. Testing is instead accomplished by the "smart" wafer translator.

Testing after wafer thinning and dicing until now has not been economically feasible or mechanically practical. Various embodiments in accordance with the present invention provide for electrical testing of thinned and diced die at the wafer level.

In one illustrative embodiment, a wafer translator having a silicon core is removably attached to the topside (i.e., the circuit-side) of a wafer that is to be thinned and tested. The wafer and wafer translator in the removably attached state may be referred to as a wafer/wafer translator pair. This removable attachment is accomplished with a soft plastic adhesive. It is noted that the wafer and wafer translator are aligned to each other prior to removable attachment. Such adhesives are known in this field and are used to bond wafers to be thinned to "carrier" wafers. the carrier wafers provide additional strength and stiffness during the back grinding, or thinning, operations. The adhesive has a coefficient of thermal expansion (CTE) or thermal of over 123 parts per million (PPM). The silicon core wafer translator and wafer to be thinned each have a CTE of 3 to 3.3 PPM. As the adhesive cools, it shrinks and pulls the wafer translator contact pins into contact with the bond pads of the integrated circuits on the wafer to be thinned. Once the wafer to be thinned is removably attached to, and electrically connected with, the wafer translator, conventional wafer thinning operations can be carried out. In this way, the wafer translator takes the place of a carrier wafer in connection with providing the needed mechanical characteristics for the thinning operations.

In some embodiments of the present invention, subsequent to completion of the thinning operations, the wafer/wafer translator pair is run through a wafer saw or laser scribe system to singulate the die. It is noted that the integrated circuits are still held firmly against the wafer translator.

The inquiry-side of the wafer translator is coupled to a test system in order to perform tests on the firmly held integrated circuits as if they were still in wafer form. Once the testing and mapping of the integrated circuits is complete, the wafer/wafer translator pair is heated to soften the wafer adhesive. Once the adhesive is softened, the integrated circuits can be removed with a pick-and-place machine. In some embodiments, the integrated circuits removed by the pick-and-place machine are then placed in bare die waffle packs for storage or shipment.

Illustrative Embodiments

FIGS. 1-16 illustrate the physical structures and process steps at various stages of thinning, testing, and singulating a wafer that is removably attached to a wafer translator in accordance with the present invention.

FIG. 1 is a cross-sectional representation of a silicon-core wafer translator 102. Silicon-core wafer translator 102 includes a silicon core 104, wafer-side translator pads 106, contact structures 108 for connecting to the bond pads of integrated circuits on a wafer, through-vias 110 for providing electrical connection between the wafer-side and the inquiry-side of the wafer translator, and inquiry-side contact pads 112.

FIG. 2 is a cross-sectional representation of silicon-core wafer translator 102 disposed inquiry-side down on a temperature controlled vacuum chuck 202. In the illustrative embodiment, vacuum chuck 202 may be heated or cooled to achieve the desired temperature. Wafer translator 102 is held in place by a vacuum applied through openings (not shown) in vacuum chuck 202. Vacuum chucks and their operation are very well known in the semiconductor industry, and are not described in greater detail herein.

FIG. 3 is a cross-sectional representation of silicon-core wafer translator 102 disposed inquiry-side down on temperature controlled vacuum chuck 202 and having a layer of wafer bonding thermo-set plastic 302 disposed on the wafer-side thereof. It is noted that wafer bonding thermoset 302 is not brought to the "set" temperature during the process of the present invention, but instead it is "melted" or "frozen".

FIG. 4 shows the structure of FIG. 3 after a plurality of openings 402 have been formed in wafer bonding thermo-set plastic 302 so as to expose wafer-side contact structures 108 of silicon-core wafer translator 102. In this illustrative embodiment, openings 302 are formed by laser ablating, or etching.

FIG. 5 shows the structure of FIG. 4 after a wafer 502 to be thinned is aligned to the wafer-side of the silicon-core wafer translator. Wafer 502 is held by a vacuum chuck 508. Wafer 502 has a topside passivation layer 506, and openings 504 in passivation layer 506. Openings 504 expose the pads of the integrated circuits on wafer 502.

FIG. 6 shows the structure of FIG. 5 after the circuit-side of wafer 502 is brought into contact with the wafer translator having the patterned wafer bonding thermoset plastic layer thereon. Heat and pressure 604 are applied to through the upper and/or lower chucks 508, 202 and a heated compressed wafer bonding thermoset 602 is between the wafer and wafer translator. The wafer translator contact structures are in contact with the integrated circuit pads 608.

FIG. 7 shows the structure of FIG. 6 after the wafer bonding thermoset plastic has cooled 702, and brought the wafer and wafer translator into tighter contact 704. The high CTE of the thermoset bonding plastic relative to the CTE of the wafer and wafer translator results in pulling of the wafer translator contact structures into tight contact with the integrated circuit pads on the wafer. At this point the upper chuck 508 is removed from the backside of wafer 502.

FIG. 8 shows the structure of FIG. 7 after a wafer thinning apparatus 802 has been brought into contact with the backside of the wafer 502 to be thinned.

FIG. 9 is similar to FIG. 8, but shows that the wafer has been reduced in thickness by the wafer thinning operation.

FIG. 10 shows the structure of FIG. 9 after the wafer thinning apparatus 802 is removed and the wafer/wafer translator pair is released from the temperature controlled vacuum chuck 202.

FIG. 11 shows the wafer/wafer translator pair of FIG. 10 inverted so that the backside of the thinned wafer is superjacent temperature controlled vacuum chuck 202 and the inquiry-side of the wafer translator is facing away from temperature controlled vacuum chuck 202.

FIG. 12 is similar to FIG. 11, but shows the backside of the thinned wafer in contact 1202 with the temperature controlled vacuum chuck.

FIG. 13 shows the structure of FIG. 12 after contact probes 1302 of tester electronics are brought into contact with contact pads 112 on the inquiry-side of the wafer translator. In this way, the integrated circuits on the wafer can be exercised by the tester through the electrical pathways provided by the wafer translator.

FIG. 14 shows the structure of FIG. 13 after the wafer/wafer translator pair is released from the temperature controlled vacuum chuck 202 and inverted.

Figure 15:
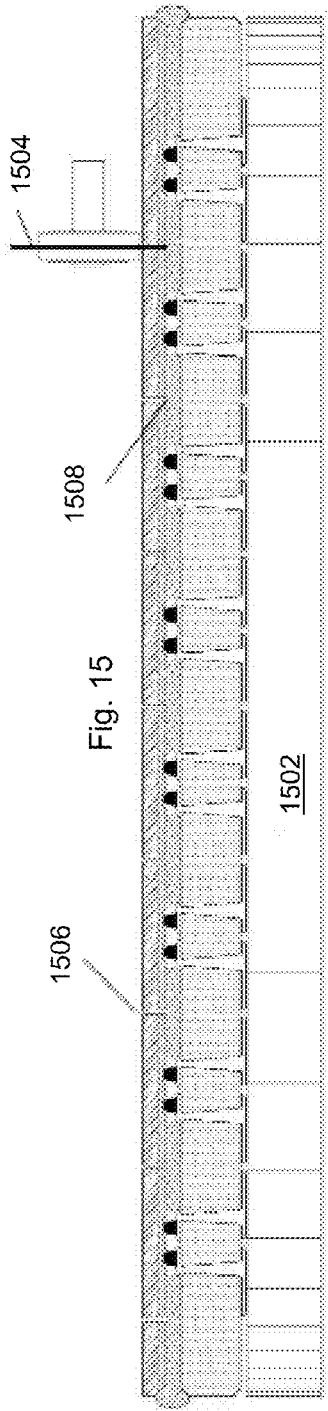
FIG. 15 shows the wafer/wafer translator pair disposed inquiry-side down on a wafer saw vacuum chuck, a wafer saw engaged with the backside of the thinned wafer, and a plurality of wafer saw kerfs.

FIG. 15 shows the wafer/wafer translator pair disposed inquiry-side down on a wafer saw vacuum chuck 1502, a wafer saw 1504 engaged with the backside of the thinned wafer, and a plurality of wafer saw kerfs 1506. Wafer saw 1504 dices the wafer, which is held tightly to the wafer translator by the wafer bonding plastic. Dicing the wafer creates the singulated integrated circuits. It is noted that in this embodiment the wafer saw cuts do not go deeper than the upper surface 1508 of the wafer bonding material. It is further noted that even after dicing, the individual integrated circuits are held in place by the wafer bonding plastic.

Figure 16:
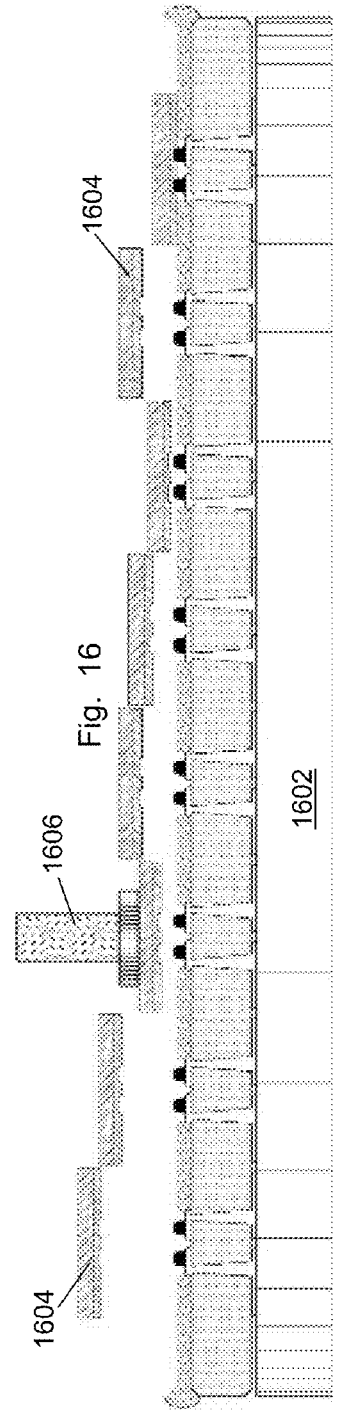
FIG. 16 shows the wafer/wafer translator pair disposed inquiry-side down on a pick-and-place vacuum chuck, and a pick-and-place vacuum collet removing individual integrated circuits from previously diced wafer.

FIG. 16 shows the wafer/wafer translator pair disposed inquiry-side down on a pick-and-place vacuum chuck 1602, and a pick-and-place vacuum collet 1606 removing individual integrated circuits 1604 from the previously diced wafer. The wafer/wafer translator pair is heated to the release temperature of the wafer bonding plastic. In this embodiment the pick-and-place system removes the individual integrated circuits through a combination of lifting and sliding.

In one illustrative example of the present invention, a method, includes providing a wafer translator having an inquiry-side and a wafer-side; disposing the wafer translator on a vacuum chuck such that the inquiry-side is facing the vacuum chuck; disposing a layer of wafer bonding thermoset plastic on the wafer-side of the wafer translator; patterning the wafer bonding thermoset plastic such that a plurality of wafer-side contact structures are exposed; providing a wafer having a topside and a backside, with a plurality of integrated circuits formed thereon; aligning the topside of the wafer to the wafer-side of the wafer translator; bringing the wafer and wafer translator into contact, and applying heat and pressure to removably attach the wafer and wafer translator, thereby forming a wafer/wafer translator pair in the attached state; thinning the wafer from the wafer backside; dicing the wafer to form one or more individual integrated circuits; and removing one or more diced integrated circuits. In this illustrative embodiment, the wafer translator has a silicon core. Some embodiments include performing wafer level testing subsequent to thinning the wafer and prior to dicing the wafer.

Other embodiments include performing wafer level testing subsequent to thinning the wafer and subsequent to dicing the wafer.

CONCLUSION

The exemplary apparatus illustrated and described herein find application in at least the field of integrated circuit manufacturing and test.

It is to be understood that the present invention is not limited to the embodiments described above, but encompasses any and all embodiments within the scope of the subjoined Claims and their equivalents.

What is claimed is:

1. A method, comprising:
   providing a wafer translator having an inquiry-side and a wafer-side;
   disposing the wafer translator on a vacuum chuck such that the inquiry-side is facing the vacuum chuck;
   disposing a layer of wafer bonding thermoset plastic on the wafer-side of the wafer translator;
   patterning the wafer bonding thermoset plastic such that a plurality of wafer-side contact structures are exposed;
   providing a wafer having a topside and a backside, with a plurality of integrated circuits formed thereon;
   aligning the topside of the wafer to the wafer-side of the wafer translator;
   bringing the wafer and wafer translator into contact, and applying heat and pressure to removably attach the wafer and wafer translator, thereby forming a wafer/wafer translator pair in the attached state;
   thinning the wafer from the wafer backside;
   performing wafer level testing subsequent to thinning the wafer and prior to dicing the wafer;
   dicing the wafer to form one or more individual integrated circuits; and
   removing one or more diced integrated circuits.

2. The method of claim 1, wherein the wafer translator has a silicon core.

3. The method of claim 1, further comprising performing wafer level testing subsequent to thinning the wafer and subsequent to dicing the wafer.

4. The method of claim 1, further comprising:
   cooling the wafer/wafer translator pair in the attached state prior to thinning the wafer.

5. The method of claim 1, further comprising:
   cooling the wafer/wafer translator pair in the attached state prior to performing wafer level testing on the wafer.

6. The method of claim 1, further comprising:
   cooling the wafer/wafer translator pair in the attached state prior to dicing the wafer.

7. The method of claim 3, wherein thinning is performed prior to dicing.

8. The method of claim 1, wherein dicing is performed by wafer sawing.

9. The method of claim 1, wherein applying heat and pressure does not bring the wafer bonding thermoset plastic to its set temperature.

10. A method, comprising:
    providing a wafer translator having an inquiry-side and a wafer-side;
    disposing the wafer translator on a vacuum chuck such that the inquiry-side is facing the vacuum chuck;
    disposing a layer of wafer bonding thermoset plastic on the wafer-side of the wafer translator;
    patterning the wafer bonding thermoset plastic such that a plurality of wafer-side contact structures are exposed;
    providing a wafer having a topside and a backside, with a plurality of integrated circuits formed thereon;
    aligning the topside of the wafer to the wafer-side of the wafer translator;
    bringing the wafer and wafer translator into contact, and applying heat and pressure to removably attach the wafer and wafer translator without bringing the bonding thermoset plastic to its set temperature, thereby forming a wafer/wafer translator pair in the attached state;
    thinning the wafer from the wafer backside;
    performing wafer level testing subsequent to thinning the wafer and prior to dicing the wafer;
    dicing the wafer to form one or more individual integrated circuits; and
    removing one or more diced integrated circuits.

11. The method of claim 10, wherein the wafer translator has a silicon core.

12. The method of claim 10, further comprising performing wafer level testing subsequent to thinning the wafer and prior to dicing the wafer.

13. The method of claim 10, further comprising performing wafer level testing subsequent to thinning the wafer and subsequent to dicing the wafer.

14. The method of claim 13, wherein thinning is performed prior to dicing.

15. The method of claim 10, further comprising:
    cooling the wafer/wafer translator pair in the attached state prior to thinning the wafer.

16. The method of claim 10, further comprising:
    cooling the wafer/wafer translator pair in the attached state prior to performing wafer level testing on the wafer.

17. The method of claim 10, further comprising:
    cooling the wafer/wafer translator pair in the attached state prior to dicing the wafer.

18. The method of claim 10, wherein dicing is performed by wafer sawing.

* * * * *